US012713944B2

(12) United States Patent
Coffy et al.

(10) Patent No.: US 12,713,944 B2
(45) Date of Patent: Aug. 18, 2026

(54) QFN PACKAGE COMPRISING TWO ELECTRONIC CHIPS WITH DIFFERENT SUBSTRATES

(71) Applicant: STMicroelectroncis (Grenoble 2) SAS, Grenoble (FR)

(72) Inventors: Romain Coffy, Voiron (FR); Younes Boutaleb, Grenoble (FR)

(73) Assignee: STMicroelectroncis (Grenoble 2) SAS, Grenoble (FR)

( * ) Notice: Subject to any disclaimer, the term of this patent is extended or adjusted under 35 U.S.C. 154(b) by 357 days.

(21) Appl. No.: 18/387,196

(22) Filed: Nov. 6, 2023

(65) Prior Publication Data

US 2024/0153880 A1 May 9, 2024

(30) Foreign Application Priority Data

Nov. 8, 2022 (FR) ....................................... 2211602

(51) Int. Cl.
*H10W 70/60* (2026.01)
*H10W 74/01* (2026.01)
(Continued)

(52) U.S. Cl.
CPC .......... *H10W 70/611* (2026.01); *H10W 74/01* (2026.01); *H10W 74/114* (2026.01);
(Continued)

(58) Field of Classification Search
CPC . H01L 23/5385; H01L 21/56; H01L 23/3121; H01L 24/48; H01L 25/0655; H01L 25/50; H01L 2224/48157; H01L 2224/48227; H01L 23/49531; H01L 23/49562; H01L 23/49568; H01L 23/49575; H01L 23/49541; H01L 23/36; H01L 23/367; H10W 70/611; H10W 74/01; H10W 74/114; H10W 90/00;
(Continued)

(56) References Cited

U.S. PATENT DOCUMENTS 9,214,416 B1 12/2015 Furnival
11,145,579 B1 10/2021 Kinzer et al.
(Continued)

OTHER PUBLICATIONS

INPI Search Report and Written Opinion for priority application, FR Appl. No. 2211602, report dated Jun. 5, 2023, 10 pgs.

*Primary Examiner* — Jonathan Han
(74) *Attorney, Agent, or Firm* — Crowe & Dunlevy LLC

(57) ABSTRACT

A package includes a mounting plate having a first part able to dissipate heat and a second part able to transmit and/or receive electrical signals. A cladding houses a first electronic chip and second electronic chip. The first electronic chip has a first semiconductor substrate (giving off, in operation, a first quantity of heat) mounted to the first part of the mounting plate and electrically connected by wires to the second part of the mounting plate. The second electronic chip has a second semiconductor substrate (giving off, in operation, a second quantity of heat) mounted to an interposer support including an interconnection network. An array of connection balls interconnects the interposer support to the first part of the mounting plate and the second part of the mounting plate. The first and second semiconductor substrates are different.

14 Claims, 2 Drawing Sheets

(51) Int. Cl.
*H10W 74/10* (2026.01)
*H10W 90/00* (2026.01)

(52) U.S. Cl.
CPC ......... *H10W 90/00* (2026.01); *H10W 90/401* (2026.01); *H10W 90/754* (2026.01); *H10W 90/755* (2026.01)

(58) Field of Classification Search
CPC ............. H10W 90/401; H10W 90/754; H10W 90/755; H10W 70/461; H10W 70/421; H10W 70/468; H10W 70/481; H10W 90/811; H10W 40/10; H10W 40/22
See application file for complete search history.

(56) References Cited

U.S. PATENT DOCUMENTS

2014/0306332 A1 10/2014 Denison et al.
2021/0242144 A1* 8/2021 Moriwaki ............... H01L 23/66
2022/0102251 A1* 3/2022 Kinzer ............. H01L 23/49562

* cited by examiner

QFN PACKAGE COMPRISING TWO ELECTRONIC CHIPS WITH DIFFERENT SUBSTRATES

PRIORITY CLAIM

This application claims the priority benefit of French Application for Patent No. 2211602, filed on Nov. 8, 2022, the content of which is hereby incorporated by reference in its entirety to the maximum extent allowable by law.

TECHNICAL FIELD

Embodiments and implementations relate to the field of microelectronics and, in particular, the field of packaging integrated circuits, and more particularly managing constraints on electronic chips (dies).

BACKGROUND

An electronic (integrated circuit) chip is a semiconductor device for performing electrical functions in a package. In particular, the electronic chip is typically manufactured from a substrate. The material of the substrate may be different from one chip to another and may be selected so as to enable the electronic chip to implement specific electrical functions.

Several electronic chips having substrates made from different materials may sometimes be used together within a single package in order at the same time to implement the specific electrical functions of each of the electronic chips, such as for example in applications related to the 5G telecommunication standard (fifth generation).

However, each of these electronic chips may have different constraints according to the material of the substrate of the electronic chips.

By way of example, an electronic chip manufactured from a gallium nitride (GaN) substrate may be used for functions involving relatively high power. Such an electronic chip typically has electronic components that can withstand high voltages. The main drawback of these electronic components is generating a relatively large quantity of heat while the electronic chip is operating. In particular, the heat generated by these components may have a negative impact on the operation of the electronic chip if this heat is not sufficiently dissipated within the package.

Consequently, it is usual to design a package the structure of which is specifically adapted to the constraints on the electronic chip, such as the heat dissipation.

In this regard, the heat generated by the electronic chip with a gallium nitride substrate can be dissipated by a package of the flat no-leads type (for example, a "Quad Flat No-leads" (QFN) type package). This is because the flat no-leads package is a type of conventional package type making it possible to effectively dissipate the heat coming from the electronic chip by means of a planar metal plate disposed at the center of a connection grid (designated by the term "lead frame").

On the other hand, the structure of the flat no-leads package may not be suitable for other electronic chips, such as for example an electronic chip manufactured from a silicon (Si) substrate having other electrical functions and requiring dense and complex electrical routing. This is because, when the electronic chip with a silicon substrate has connections that are much too complex to be connected to the connection grid of such a package, use is rather made of packages of the land grid array (LGA) type or of the ball grid array (BGA) type.

It is then necessary to design several packages for each electronic chip according to its constraints. This is because each type of package as aforementioned has a structure that may be compatible with one electronic chip without being compatible for the other electronic chip.

Thus, the flat no-leads package does not have a structure capable of managing the connection of the electronic chip with a silicon substrate that is often too complex for this type of package.

Likewise, packages of the land grid array type or of the ball grid array type do not have a structure making it possible to sufficiently dissipate the heat produced by an electronic chip with a gallium nitride substrate.

This therefore poses a design problem leading, in particular, to a greater bulk of a system that has to incorporate these separate packages as well as an increase in manufacturing costs.

There is consequently a need to propose a solution to this problem.

SUMMARY

According to one embodiment and implementation a package is proposed the structure of which is compatible with the constraints of each of the aforementioned electronic chips and making it possible to house together, within this single package, chips having different constraints, in particular in terms of heat dissipation and routing of the connections.

According to one aspect, a package is proposed, typically a quad flat no-leads (QFN) package, comprising: a mounting plate having a first part, for example central, able to dissipate heat and a second part, for example peripheral, able to transmit and/or receive electrical signals; a cladding housing both a first electronic chip having a first semiconductor substrate and configured to give off, in operation, a first quantity of heat and a second electronic chip having a second semiconductor substrate and configured to give off, in operation, a second quantity of heat, the two semiconductor substrates being different and the second quantity of heat being less than the first quantity of heat; the first chip being thermally coupled to the first part and electrically coupled to the second chip as well as to the second part at least by means of connecting wires, the second chip being thermally coupled to the first part and electrically coupled to the second part by means of at least a first array of connection balls.

The package, typically of the flat no-leads type, makes it possible to house a first electronic chip, which may, for example, be an electronic chip having a substrate including gallium nitride, capable of producing a relatively large quantity of heat.

This package has the advantage of being able to house also a second electronic chip that is not normally designed for being assembled in a conventional package of the flat no-leads type, typically a chip having complex connections.

In particular, the package is adapted both to the thermal constraints of the first chip and to the electrical-connection constraints of the second chip.

Consequently, the first chip and the second chip can cohabit in a single package and can be electrically coupled together therein. The electrical coupling between the first chip and the second chip by at least connecting wires makes it possible, in particular, to improve the impedance ratio between the two chips and therefore to optimize the transmission of signals between these two chips.

According to one embodiment, the first substrate includes gallium nitride and the second substrate includes silicon.

Gallium nitride is used for manufacturing electronic components operating at high power and/or at high frequencies, which can emit a relatively large quantity of heat. Silicon is used for manufacturing other types of electronic component, such as components using CMOS technology, which may sometimes require a complex connection interface that is typically provided in conventional packages of the ball grid array or land grid array type.

According to one embodiment, the first quantity of heat corresponds to a dissipated power of several watts, for example 5 watts.

According to one embodiment, the second quantity of heat corresponds to a dissipated power of less than 1 watt, for example 0.6 W.

According to one embodiment, the package comprises a support, for example an interposer according to a term known to a person skilled in the art, having a mounting face and an attaching face opposite to the mounting face, the attaching face being connected to the first part and to the second part of the mounting plate by means of the first connection ball grid array, the mounting face being connected to the second chip by means of the second connection ball grid array.

The support comprises an interconnection network configured to electrically couple the first ball grid array, the second ball grid array and the first chip.

The support makes it possible to connect the second electronic chip to the electrical contacts located in the second part of the mounting plate. This is because the interconnection network of the support may provide a plurality of conductive tracks, integrated in one or more dielectric layers, making it possible to electrically connect the connection balls of the first grid array to the connection balls of the second grid array. In particular, the distance separating the connection balls of the second grid array (the pitch) makes it possible to align the connection balls with the electrical contacts present on the second part of the mounting plate.

Moreover, the interconnection network also provides conductive tracks allowing the transmission of signals between the first chip and the second chip.

According to one embodiment, the electrically conductive connection wires include first connecting wires and second connecting wires.

The first electronic chip has a rear face secured to the first part of the mounting plate by a layer of thermally conductive glue and a front face electrically connected to the second part of the mounting plate by the first connecting wires and electrically connected to the interconnection network by the second connecting wires.

According to one embodiment, the cladding may house at least one surface-mount device component and the interconnection network of the support is also configured to electrically couple said at least one surface-mount device component to the first electronic chip and to the second electronic chip.

The surface of the support can make it possible to attach a plurality of surface-mount device components, which can then be electrically coupled to the first electronic chip and/or to the second electronic chip. In particular, the support can make it possible to connect more surface-mount device components than a mounting plate of a conventional package.

According to one embodiment, the first part is a central part and the second part is a peripheral part.

According to another aspect, a method is proposed for manufacturing a package comprising: forming a mounting plate having a first part able to dissipate heat and a second part able to transmit and/or receive electrical signals; forming a first electronic chip having a first semiconductor substrate and configured to give off, in operation, a first quantity of heat; forming a second electronic chip having a second semiconductor substrate and configured to give off, in operation, a second quantity of heat, the two semiconductor substrates being different and the second quantity of heat being less that the first quantity of heat; thermally coupling the first chip to the first part and electrically coupling the first chip to the second chip and to the second part at least by means of connecting wires; thermally coupling the second chip to the first part and electrically coupling the second chip to the second part by means of at least a first connection ball grid array; and forming a cladding housing at least the first chip and the second chip.

According to one embodiment, the method comprises: forming a support having a mounting face and an attaching face opposite to the mounting face; connecting the attaching face of the support to the first part and to the second part of the mounting plate by means of the first array of connection balls; connecting the mounting face of the support to the second chip by means of a second connection ball grid array; forming an interconnection network on and in the support so as to electrically couple the first ball array, the second ball array and the first chip.

According to one embodiment, the method comprises connecting at least one surface-mount device component to the first electronic chip and to the second electronic chip and housing of said at least one surface-mount device component within the cladding.

According to one embodiment, forming the mounting plate comprises forming a first central part and forming a second peripheral part.

The package is advantageously of the quad flat no-leads (QFN) type.

BRIEF DESCRIPTION OF THE DRAWINGS

Other advantages and features of the invention will emerge from the examination of the detailed description of embodiments and implementations, which are in no way limitative, and of the accompanying drawings, on which.

DETAILED DESCRIPTION OF THE DRAWINGS

Figure 1:
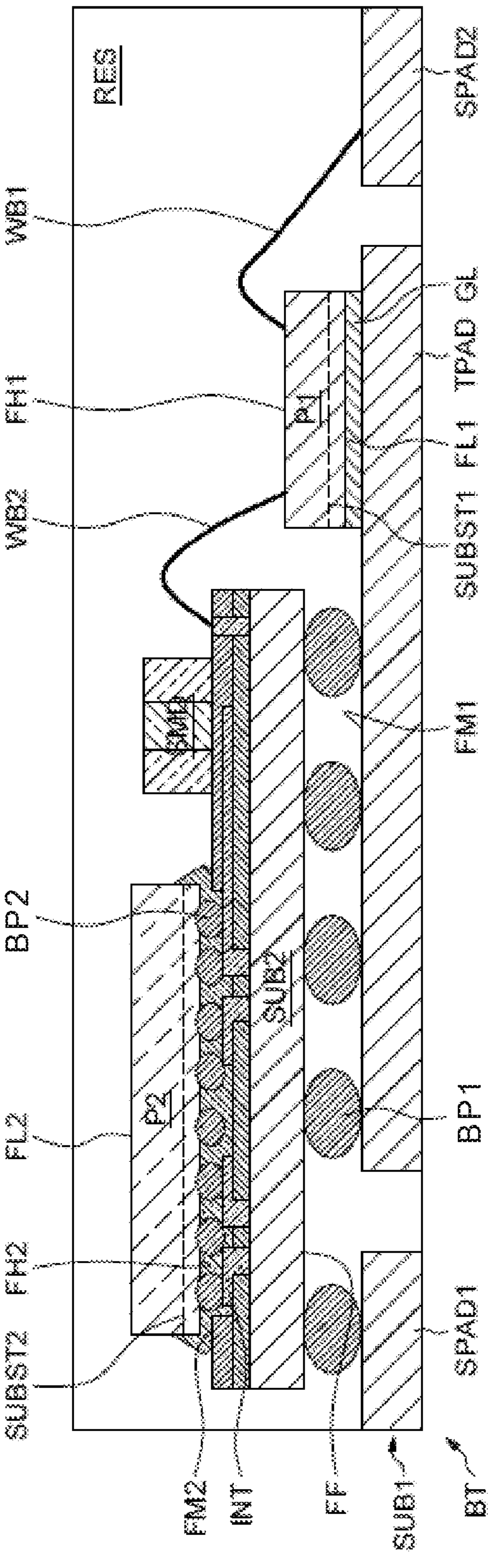
FIG. 1 illustrates schematically a view in cross section of a package.

FIG. 1 illustrates schematically a view in cross section of a package BT, here a so-called quad flat no-leads (QFN) type package, or more generally a flat no-leads type package, according to one embodiment.

The package BT comprises a mounting plate SUB1 and a cladding RES housing a first electronic (integrated circuit) chip P1. The first electronic chip P1 may, for example, be an electronic chip manufactured from a substrate SUBSTR1 the material of which comprises gallium nitride (GaN) or silicon carbide (SiC).

The first electronic chip P1 has a rear face FL1 and a front face FH1. The first electronic chip P1 is configured, in operation, to give off a first quantity of heat. This is because the front face FH1 of the first electronic chip P1 typically comprises electronic components, such as high-voltage transistors, able to generate a relatively large quantity of heat. The first quantity of heat corresponds to a dissipated power of several watts, typically between 1 and 10 watts, for example 5 watts. The first quantity of heat may require suitable thermal dissipation to avoid any malfunctioning of the electronic components inside the package.

For this purpose, the mounting plate SUB1 (of the type known to a person skilled in the art by the term "lead frame") has a central part (also referred to as a die pad) TPAD able to dissipate heat, in particular the heat generated by the first electronic chip P1 during operation thereof. The central part TPAD of the mounting plate SUB1 may be a metal plate that usually has a planar surface and the material of which is thermally conductive. The material of the central part TPAD may for example be copper (Cu) and may have a thermal conductivity of the order of 385 W/mK.

The rear face FL1 of the first electronic chip P1 is attached to a mounting face FM1 of the central part TPAD of the mounting plate SUB1 by a layer of thermally conductive glue GL known per se.

Moreover, the mounting plate SUB1 also has a peripheral part (also referred to as an array of leads) SPAD1, SPAD2 able to transmit and/or receive electrical signals. The peripheral part SPAD1, SPAD2 of the mounting plate SUB1 typically has electrical contacts located around the central part TPAD. Such electrical contacts make it possible to connect an electronic chip of the package, for example the first electronic chip P1, to a printed circuit board.

More particularly, the front face FH1 of the first electronic chip P1 is electrically connected to an electrical contact SPAD2 located in the peripheral part of the mounting plate SUB1 by first connecting wires WB1.

The cladding RES of the package BT furthermore houses a second electronic (integrated circuit) chip P2. The second electronic chip P2 is, for example, an electronic chip manufactured from a substrate SUBSTR2 the material of which may comprise silicon (Si). The second electronic chip P2 has a rear face FL2 and a front face FH2 including electronic components, such as transistors. The second electronic chip P2 is configured, in operation, to give off a second quantity of heat. The second quantity of heat corresponds to a dissipated power of less than 1 watt, for example 0.6 watts.

The package BT also comprises a support SUB2. The support SUB2 has a mounting face FM2 and an attaching face FF opposite to the mounting face FM2.

The attaching face FF of the support SUB2 is attached to the central part TPAD and to the peripheral part SPAD1 of the mounting plate SUB1 by a first array of connection balls BP1 (referred to in the art as "bumps"). The connection balls of the first array BP1 are electrically and thermally conductive metal balls.

The second electronic chip P2 is attached to the mounting face FM2 of the support plate SUB2 by a second array of connection balls BP2. The connection balls of the second array BP2 are also electrically and thermally conductive metal balls.

The second array of balls BP2 typically makes it possible to connect the second electronic chip P2 to a mounting plate of a conventional package of the ball grid array (BGA) type, for example. The second chip P2, using for example CMOS technology, can provide an array BP2 with connection balls very close to one another in order to connect the electronic components of the second chip P2 with this type of package.

By way of indication, the balls of the array BP2 may be spaced apart from each other by a distance of between 70 μm and 200 μm.

Conversely, the connection balls of the first array BP1 are more spaced apart and make it possible to align the connection balls with the electrical contacts of the peripheral part SPAD1. The first array of connection balls BP1 makes it possible to keep the support SUB2 attached to the mounting plate SUB1, in particular at the central part TPAD thereof, and also to maintain an electrical connection between the second electronic chip P2 and the electrical contacts SPAD1 located in the peripheral part SPAD1 of the mounting plate SUB1.

By way of indication, the balls of the array BP1 may be spaced apart from each other by a distance of between 0.4 mm and 0.8 mm.

In a variant (not shown on the figures), the second electronic chip P2 may be attached to the mounting face FM2 of the support SUB2 in accordance with a connection mounting by connecting wires (referred to in the art as "wirebonding"). According to this variant, the rear face FL2 of the second electronic chip P2 is attached to the mounting face FM2 of the support SUB2 by a layer of glue. The front face FH2 of the second electronic chip P2 is electrically connected to the support SUB2 by connecting wires.

The support SUB2 is, for example, a laminated substrate advantageously comprising an interconnection network INT between the mounting face FM2 and the attaching face FF. The interconnection network INT typically comprises conductive tracks, for example made from copper, integrated in one or more dielectric layers, which may for example be epoxy resin matrices with optionally glass fibers.

The conductive tracks of the interconnection network INT allow transmission of signals between the second electronic chip and the electrical contacts located in the peripheral part SPAD1. More particularly, several conductive tracks may electrically and thermally connect the connection balls of the first array BP1 to the connection balls of the second array BP2.

The first array of balls BP1 and the second array of balls BP2 as described previously allow, in particular by means of the conductive tracks, heat transfers between the second electronic chip P2 and the central part TPAD of the mounting plate SUB1. The heat generated by the first electronic chip P1 and by the second electronic chip P2 during operation thereof can thus be discharged outside the package BT by the central part TPAD of the mounting plate SUB1.

Moreover, the front face FH1 of the first electronic chip P1 is electrically connected to the interconnection network INT of the support SUB2 by second connecting wires WB2. Conductive tracks can also be provided for electrically connecting the connection balls of the first array BP1 and of the second array BP2 to the second connecting wires WB2. Thus, the interconnection network INT makes it possible to electrically couple the first electronic chip P1, the second electronic chip P2 and the peripheral part SPAD1 of the mounting plate SUB1.

The support SUB2 therefore has a role of connection interface between the second electronic chip P2 and the mounting plate SUB1 of the package BT since it makes it possible to convey the signals between the electrical contacts located in the peripheral part SPAD1 and the second chip P2 which is normally not designed to be assembled in a conventional package of the flat no-leads type.

Consequently, the electronic chips P1 and P2 can cohabit in one and the same package BT and can furthermore be electrically coupled together inside that same package. The electrical coupling between the first chip P1 and the second chip P2 makes it possible, in particular, to improve the impedance ratio between the two chips and therefore to optimize the transmission of signals between these two chips.

Figure 2:
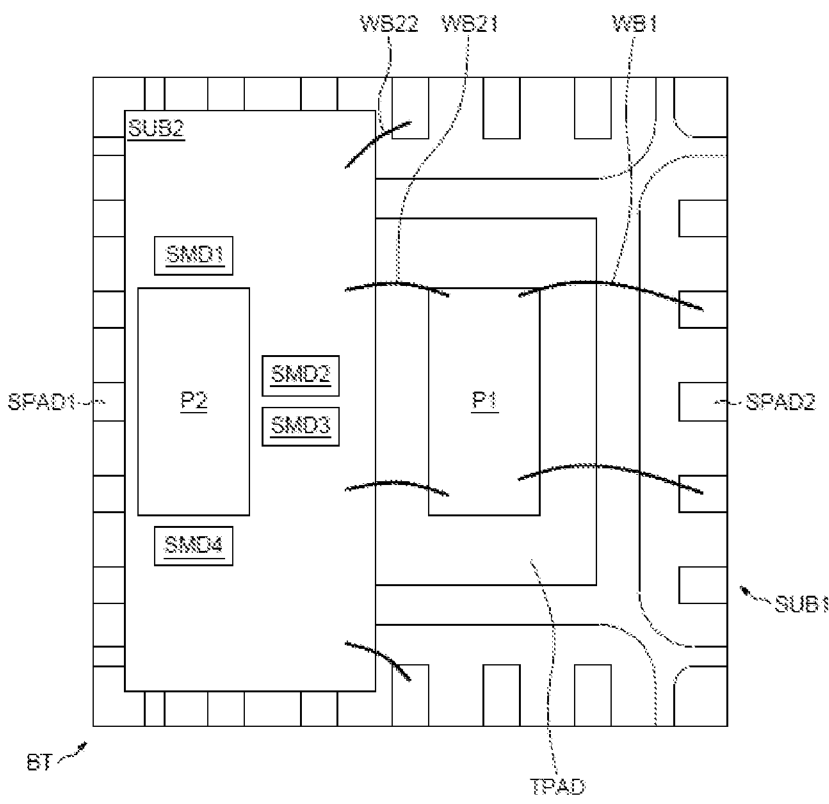
FIG. 2 illustrates schematically a plan view of the package shown in FIG. 1.

FIG. 2 illustrates schematically a plan view of the package BT described previously in relation to FIG. 1.

The first electronic chip P1 is preferably connected to the closest electrical contacts in the peripheral part SPAD2 of the mounting plate SUB1 by the first connecting wires WB1.

The support SUB2 has, on its mounting face FM2, contacts that can be electrically connected to the front face FH1 of the first electronic chip P1 by connecting wires WB21. The mounting face FM2 may also comprise other contacts that can be electrically connected to the closest electrical contacts in the peripheral part SPAD2 of the mounting plate SUB1, by other connecting wires WB22.

The interconnection network INT makes it possible to electrically couple the first electronic chip P1 and the second electronic chip P2, in particular by means of the connecting wires WB21. The network of interconnections INT also makes it possible to electrically couple the second electronic chip P2 and the peripheral part SPAD1 of the mounting plate SUB1, in particular by means of the connecting wires WB22.

Moreover, the package BT here furthermore comprises four surface-mount device components, designated by the references SMD1 to SMD4, attached to the mounting face FM2 of the support SUB2. The surface-mount device components SMD are, for example, passive electronic components such as capacitive elements resistive elements or inductive elements. The surface-mount device components SMD may be soldered to electrical contacts present on the surface of the support SUB2 and are electrically connected to the network of interconnections INT. The network of interconnections INT is furthermore configured to electrically couple the surface-mount device components SMD to the first electronic chip P1 and/or to the second electronic chip P2.

Consequently, the surface of the support SUB2 makes it possible to attach a plurality of surface-mount device components SMD, which can then be electrically coupled to the first electronic chip P1 and/or to the second electronic chip P1 by the interconnection network INT. In particular, the support SUB2 makes it possible to connect more surface-mount device components SMD than a mounting plate of a conventional package of the flat no-leads type.

Figure 3:
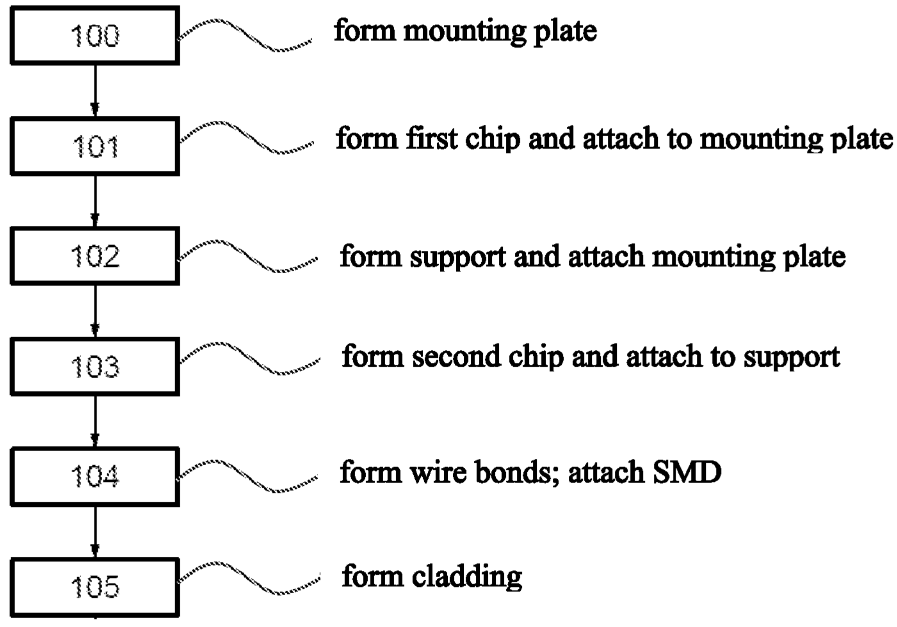
FIG. 3 illustrates steps of a method for manufacturing an integrated-circuit package as shown in FIGS. 1 and 2.

FIG. 3 illustrates an example of a method for manufacturing an integrated-circuit package BT as described previously in relation to FIGS. 1 and 2.

The method comprises a step 100 of forming the mounting plate SUB1. The formation step 100 comprises in particular the formation of the central part (die pad) TPAD of the mounting plate SUB1 and the formation of the electrical contacts (leads) SPAD1 and SPAD2 of the peripheral part of the mounting plate SUB1.

The method also comprises a step 101 of forming the first electronic chip P1. The rear face FL1 is attached to the central part TPAD of the mounting plate SUB1 by a layer of thermally conductive glue GL. In this formation step 101, the front face FH1 of the first electronic chip P1 is electrically connected to the electrical contacts SPAD2 by the first conductive wires WB1.

The method also comprises a step 102 of forming the support SUB2 having a mounting face FM2 and an attaching face FF opposite to the mounting face FM2. The formation 102 of the support plate SUB2 comprises in particular the formation of the network of interconnections INT between the mounting face FM2 and the attaching face FF of the support SUB2. In this step 102, the attaching face FF of the support SUB2 is attached to the central part TPAD and to the peripheral part SPAD1 by the first array of connection balls BP1.

The method also comprises a step 103 of forming the second electronic chip P2 having a rear face FL2 and a front face FH2. The front face FH2 of the second electronic chip P2 typically includes electronic components.

In this step 103, the front face FH2 is attached by soldering to the mounting face FM2 of the support SUB2 by the second array of connection balls BP2. In this way, the second chip P2 is thermally coupled to the central part TPAD and electrically coupled to the peripheral part SPAD1 of the mounting plate SUB1 by means of the first ball grid array BP1, the second ball grid array BP2 and the interconnection network INT.

As an alternative, the rear face FL2 of the second chip P2 could be attached to the mounting face FM2 of the support SUB2 by a layer of glue and the front face FH2 is connected to the mounting face FM2 by soldering of connecting wires.

The method comprises a wirebonding step 104 of soldering the connecting wires WB21 between the mounting face FM2 of the support SUB2 and the front face FH2 of the first electronic chip P1. At the end of the soldering described in the step 103, the first ball grid array BP1, the second ball grid array BP2 and the first chip P1 are electrically coupled by the interconnection network INT.

The step 103 of forming the second chip P2 may be implemented before the step 102 of forming the support SUB2, i.e., by first attaching the second chip P2 to the mounting face FM2 of the support SUB2 and next attaching the attaching face FF of the support SUB2 to the central part TPAD and to the peripheral part SPAD1 of the mounting plate SUB1.

Furthermore, the method may comprise a connection in step 104 of at least one surface-mount device component SMD to the first chip P1 and to the second chip P2. In particular, the connection 104 comprises a soldering of said at least one surface-mount device component SMD to the mounting face FM2 of the support SUB2 so that said at least one surface-mount device component SMD is electrically coupled to the interconnection network INT.

The method comprises a formation in step 105 of a cladding RES (for example, using an encapsulation process). The cladding RES, which may for example be resin, is formed around the first chip P1 and the second chip P2 by molding techniques well known to a person skilled in the art.

The invention claimed is:

1. A package, comprising:

a leadframe having a die pad part configured to dissipate heat, a first set of leads part, and a second set of leads part configured to transmit and/or receive electrical signals;

a first electronic chip having a first semiconductor substrate;

a second electronic chip having a second semiconductor substrate;

wherein the first and second semiconductor substrates are different;

a laminated interconnection support having a mounting face and an attaching face opposite to the mounting face;

a cladding encapsulating the first and second electronic chips and the laminated interconnection support;

wherein the first electronic chip is mounted to the die pad part of the leadframe, electrically coupled to the second electronic chip by connecting wires, and electrically coupled to the second set of leads part of the leadframe by connecting wires; and wherein the second electronic chip is mounted to the mounting face of the laminated interconnection support, with the attaching face of the laminated interconnection support mounted to the die pad part of the leadframe through a first array of connection balls, and with the attaching face of the laminated interconnection support electrically coupled to the first set of leads part of the leadframe by said a first array of connection balls.

2. The package according to claim 1, wherein the first semiconductor substrate is configured to give off, in operation, a first quantity of heat, wherein the second semiconductor substrate is configured to give off, in operation, a second quantity of heat, and wherein the second quantity of heat is less than the first quantity of heat.

3. The package according to claim 2, wherein the first quantity of heat corresponds to a dissipated power of several watts.

4. The package according to claim 3, wherein the second quantity of heat corresponds to a dissipated power of less than 1 watt.

5. The package according to claim 1, being of the flat no-leads type.

6. The package according to claim 1, wherein the first semiconductor substrate includes gallium nitride.

7. The package according to claim 6, wherein the second semiconductor substrate includes silicon.

8. The package according to claim 1, wherein the mounting face of the laminated interconnection support is connected to the second electronic chip by a second array of connection balls, and wherein the laminated interconnection support comprises an interconnection network configured to electrically couple the first array of connection balls and the second array of connection balls.

9. The package according to claim 8, wherein the connecting wires include first connecting wires and second connecting wires, the first electronic chip has a rear face attached to the part of the leadframe by a layer of thermally conductive glue and a front face electrically connected to the part of the leadframe by the first connecting wires and electrically connected to the interconnection network by the second connecting wires.

10. The package according to claim 8, further comprising at least one surface-mount device component mounted to the laminated interconnection support and encapsulated within the cladding, and wherein the interconnection network of the laminated interconnection support is also configured to electrically couple said at least one surface-mount device component to the first electronic chip and to the second electronic chip.

11. A package, comprising:

a leadframe including a die pad and a plurality of leads;

a first electronic chip having a first semiconductor substrate with a rear face mounted to the die pad and a front face electrically connected to first ones of the plurality of leads by first bonding wires;

a support including an interconnection network with a rear face electrically connected by first bumps to the die pad and to second ones of the plurality of leads;

a second electronic chip having a second semiconductor substrate with a first face mounted to a front face of the support and electrically connected to the interconnection network; and a cladding encapsulating the leadframe, the support and the first and second electronic chips;

wherein the first and second semiconductor substrates are different.

12. The package of claim 11, wherein the first face of the second electronic chip is a front face with second bumps electrically connected to the interconnection network at the front face of the support.

13. The package of claim 11, further comprising second bonding wires electrically connecting the front face of the first electronic chip to the interconnection network at the front face of the support.

14. The package of claim 11, further comprising a surface mount device mounted and electrically connected to the interconnection network at the front face of the support, wherein the surface mount device is encapsulated within the cladding.

* * * * *